United States Patent
Balz et al.

(10) Patent No.: US 7,443,912 B2
(45) Date of Patent: Oct. 28, 2008

(54) METHOD AND SYSTEM FOR DISPLAYING THE AMPLITUDE DISTORTIONS OF A TRANSMISSION CHANNEL

(75) Inventors: Christoph Balz, Munich (DE); Wolfgang Feicht, Ampfing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1180 days.

(21) Appl. No.: 10/169,969

(22) PCT Filed: Jan. 16, 2001

(86) PCT No.: PCT/EP01/00436

§ 371 (c)(1), (2), (4) Date: Jul. 11, 2002

(87) PCT Pub. No.: WO01/54295

PCT Pub. Date: Jul. 26, 2001

(65) Prior Publication Data

US 2002/0198671 A1    Dec. 26, 2002

(30) Foreign Application Priority Data

Jan. 20, 2000   (DE)   ................. 100 02 337

(51) Int. Cl.
*H04B 17/00* (2006.01)
(52) U.S. Cl. .............................. 375/228; 702/67
(58) Field of Classification Search ............. 375/224, 375/228, 316; 702/57, 66, 67; 324/76.19, 324/76.21
See application file for complete search history.

(56) References Cited

U.S. PATENT DOCUMENTS

| 4,591,848 | A | * | 5/1986 | Morozumi et al. ........... 345/3.1 |
| 4,611,926 | A | * | 9/1986 | Hayashi ....................... 368/120 |
| 4,920,543 | A | * | 4/1990 | Martin ......................... 375/225 |
| 5,420,501 | A | * | 5/1995 | Matsuoka ................. 324/76.21 |
| 5,448,911 | A | * | 9/1995 | Mason ..................... 73/152.47 |
| 6,041,019 | A | * | 3/2000 | Jackson et al. .............. 367/124 |
| 6,334,852 | B1 | * | 1/2002 | Seyl ............................ 600/587 |
| 6,335,905 | B1 | * | 1/2002 | Kabel .......................... 367/98 |

FOREIGN PATENT DOCUMENTS

DE    42 33 222 A1    4/1994

(Continued)

OTHER PUBLICATIONS

Shake et al., *Electronics Letters*, "Optical signal quality monnitoring method based on optical sampling", vol. 34, No. 22, pp. 2152-2154 (Oct. 29, 1998).

(Continued)

*Primary Examiner*—Kevin M Burd
(74) *Attorney, Agent, or Firm*—Caesar, Rivise, Bernstein, Cohen & Pokotilow, Ltd.

(57) ABSTRACT

In order to display the amplitude distortions of a transmission channel, the amplitude distribution of a measurement signal of a known amplitude distribution is measured at the output of the transmission channel. Based on a given multitude of amplitude measured values that are measured and digitized in succession, the frequency of occurrence of the amplitude distribution is then determined and displayed in adjacently connected amplitude windows.

7 Claims, 3 Drawing Sheets

FOREIGN PATENT DOCUMENTS

| | | |
|---|---|---|
| DE | 198 38 295 A1 | 6/1999 |
| EP | 0 518 116 A1 | 12/1992 |
| JP | 07334146 A * | 12/1995 |
| WO | WO 99/17463 A2 | 9/1998 |

OTHER PUBLICATIONS

Mueller, et al., ECOC 98, "Application of Amplitude Histograms for Quality of Service Measurements of Optical Channels and Fault Identification", pp. 707-708, 20-24, Sep. 1998.

* cited by examiner and
METHOD AND SYSTEM FOR DISPLAYING THE AMPLITUDE DISTORTIONS OF A TRANSMISSION CHANNEL In order to measure the characteristics of a transmission channel with regard to non-linear amplitude distortions, the amplitude distribution of a measurement signal to be transmitted, which has an amplitude distribution that is known in theory, can be used. Deviations from this ideal amplitude distribution can thus be attributed to the influence of the transmission channel. Limiting power output stages of high-frequency transmitters and the like can be measured in this way for example with regard to non-linear amplitude distortions.

SUMMARY OF THE INVENTION

The object of the invention is to present a particularly clear and for the user advantageous display of the measuring result of such a measurement of the amplitude distribution.

Due to the evaluation according to the invention of the frequency distribution of the multitude of amplitude measured values that are measured in succession, with simultaneous matching data reduction and display of the frequency distribution in frequency values combined to give amplitude windows, a particularly clear and rapidly evaluatable display is created for the user of a corresponding measuring receiver, as shown in FIG. 3.

BRIEF DESCRIPTION OF SEVERAL VIEWS OF THE DRAWINGS

The method according to the invention is explained in greater detail below with reference to schematic drawings, wherein.

DETAILED DESCRIPTION OF THE INVENTION

Figure 1:
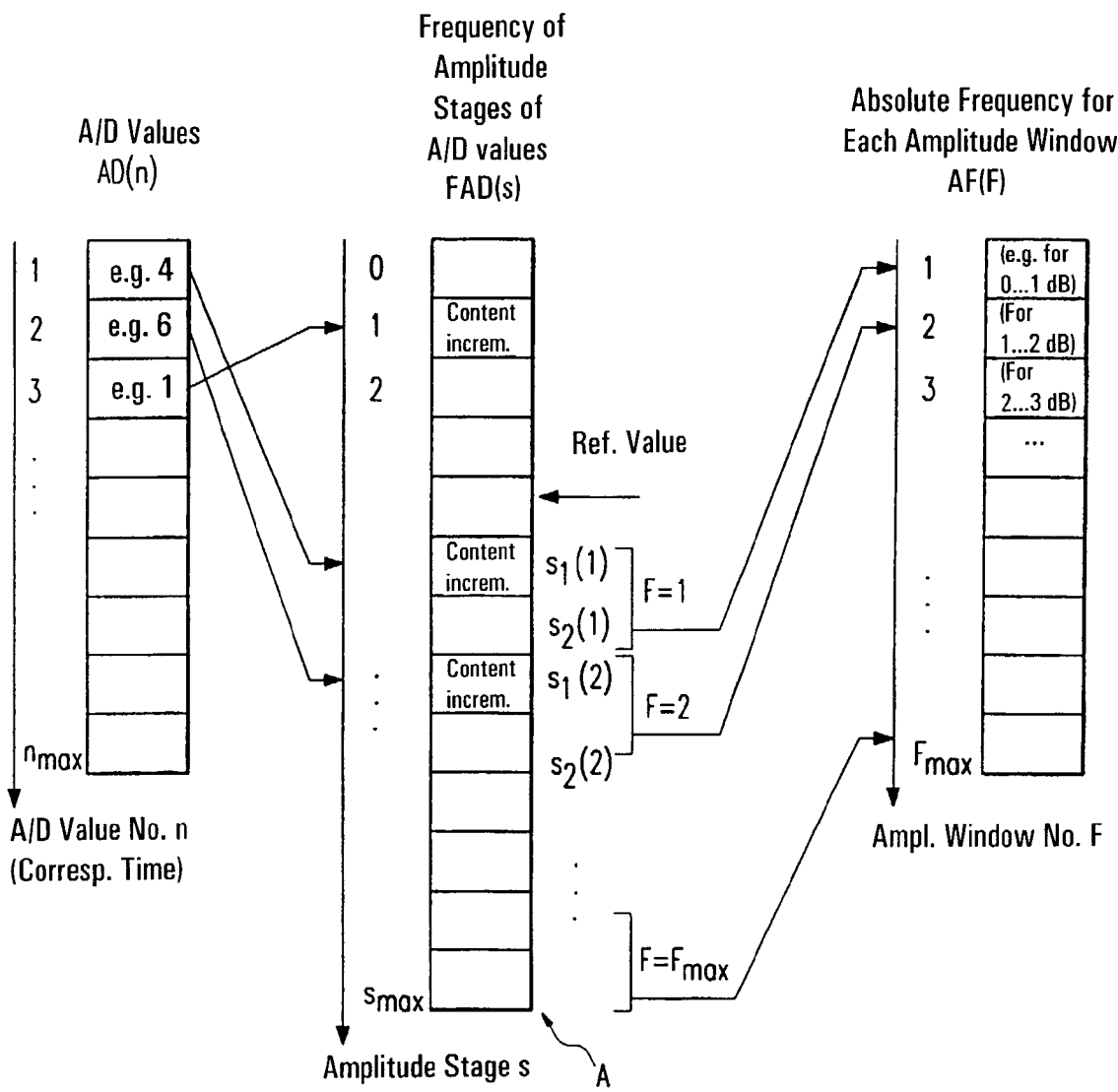
FIG. 1 is schematic view of a processor of the invention.

The successive amplitude measured values measured by a measuring receiver for example at the output of a transmitter output stage to be measured are digitized via an A/D converter and processed further as successive digital values via a processor according to FIG. 1. For a first representation, a predetermined number $n_{max}$ of digital values, which correspond to a predetermined measuring time, is evaluated, in practice 100000 successive measured values for example. These successive measured values are now sorted according to frequency, to do this the respective memory cell of memory A from $S_{max}+1$ memory cells with an address corresponding to the amplitude value of the measured value evaluated in each case is incremented for each measured value AD (n) according to FIG. 1 (theoretically possible amplitude values: 0 to $s_{max}$). In the example according to FIG. 1, the amplitude values 4, 6, 1, thus integer numerical values respectively, are measured in succession, for example. As indicated by the arrows drawn, their frequency is counted in the related memory cells $s=0$ to $s_{max}$, at the end following the evaluation of all $n_{max}$ amplitude values their frequency distribution is thus stored in memory A. In practice memory A has for example 1024 successive memory cells.

A reference value, for example the root-mean-square value, that is used in the final display as the reference value is then calculated from these stored frequency values. For a logarithmic display scale, the root-mean-square value is the most suitable. The reference value Ref is calculated by way of the formula indicated in FIG. 1 from the sum of the amplitude frequency HAD, the number of amplitude stages $s_{max}+1$ of the memory A and the evaluated number $n_{max}$ of amplitude values.

To simplify the display of the amplitude distribution of the output signal measured still further, the amplitude frequency values of the memory A above the reference value Ref are respectively combined and added to give so-called amplitude windows F=1 to $F_{max}$. The lower and upper limits of the amplitude windows F are respectively designated $s_1$ and $s_2$. In the case of window boundaries that do not precisely meet the middle between two amplitude stages of the measured values supplied by the A/D converter, the value of the frequency of the amplitude stage concerned must be distributed weightedly to two windows to increase the accuracy of the result. Due to this combination of frequency values, the absolute frequency AH (F) is finally obtained for each amplitude window F and displayed. In the example shown according to FIG. 1, 20 adjacently connected amplitude windows F for example are provided above the reference value of 0 dB calculated as the root-mean-square value, the range 0 to 1 dB being assigned to the first window, 1 to 2 dB to the second window, 2 to 3 dB to the third window etc.

Figure 3:
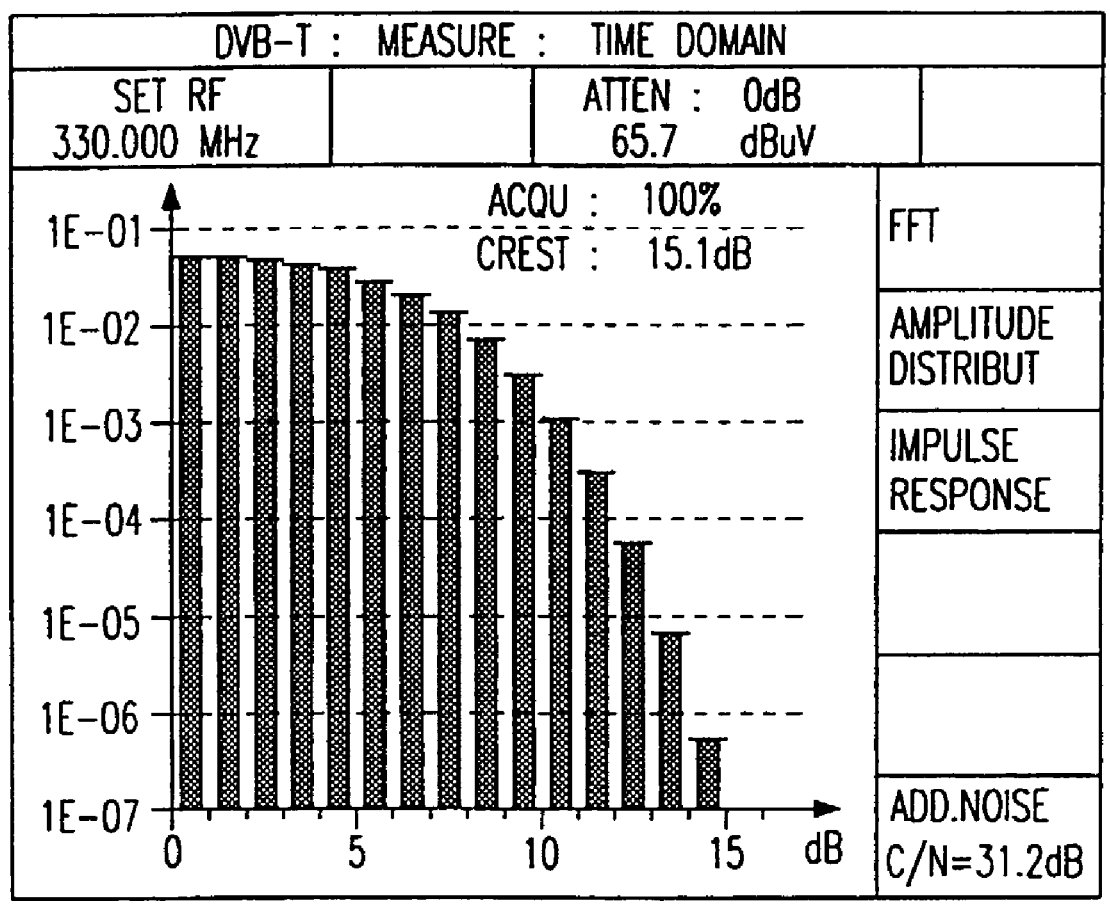
FIG. 3 is a view of an exemplary display of the invention.

FIG. 3 shows the display derived therefrom on a screen or due to a printout by means of a printer. The 1-dB amplitude windows F are entered in a horizontal direction, and the amplitude distribution, i.e. the number of measured values in the respective amplitude window relative to the number of measured values recorded in total, in a vertical direction as bars. 1E-2 means for example that $10^{-2}$, thus 1% of all measured values, are located within this 1-dB window.

The crest factor, the calculation formula of which is indicated in FIG. 1, can also be calculated easily from the greatest amplitude stage s of the memory A actually occurring and from the reference value Ref calculated as the root-mean-square value, and displayed.

A certain number z of measured values AD (n) is required for a statistically significant statement regarding the actual amplitude distribution. In many cases, the stated multitude $n_{max}$ is not sufficient for this, thus $k_{max}=z/n_{max}$ measured values have to be recorded to attain the required measuring accuracy. To do this, a ring memory structure of the length $k_{max}$ is used according to FIG. 2. First the relevant absolute frequency AH (F) is ascertained for each amplitude window F for a first multitude $n_{max}$ of measured values according to the processing scheme according to FIG. 1 and entered in the first memory cell row k=1 of the ring structure, to be precise together with the reference value likewise calculated according to FIG. 1 and also together with the crest factor. Then the absolute frequency is again ascertained for each amplitude window according to the scheme according to FIG. 1 for the second multitude $n_{max}$ of measured values and entered in the second memory cell row k=2 etc. until the entire ring structure is fully described by $k_{max}$ elements. Following each entry in a memory cell row k, the measurement is shown on the display, taking the measured values processed up to now into account. Following entry in $k_{max}$, the first row k=1 of the ring structure is overwritten again, so that only the most up-to-date measured values are always processed. From the absolute frequency values stored thus in the ring structure, the cumulative frequency is calculated for each amplitude window and from this finally the relative frequency for each amplitude window, which frequency is then finally displayed according to FIG. 3. The ring structure can consist for example of k=100 individual memory cell rows. The relative amplitude frequency for each amplitude window that is finally displayed according to FIG. 3 is calculated here from the added absolute amplitude frequency for each amplitude window divided by the number of measured values that have occurred so far, as indicated by the formulae according to FIG. 2.

Figure 2:
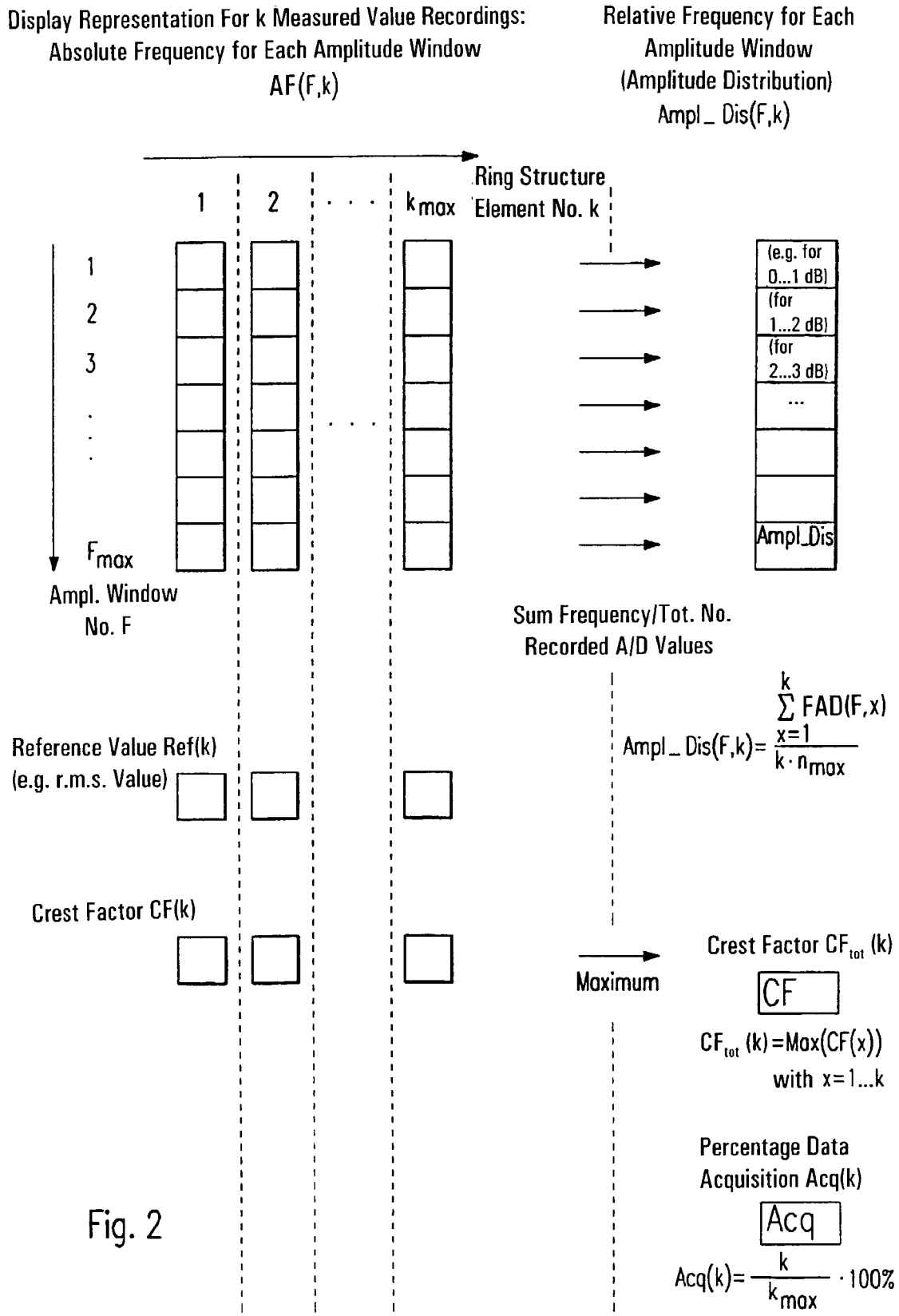
FIG. 2 is another schematic view of a processor of the invention.

The crest factor can also be determined from the maximum of the crest factors calculated hitherto and displayed, as likewise indicated by the formula in FIG. 2.

Finally, the current percentage of the number of recorded measured values required in all for a statistically significant statement can be displayed and corresponds to the number of entries k currently present in the ring structure divided by $k_{max}$ according to the formula likewise indicated in FIG. 2.

In order to compare the amplitude distribution measured, as represented in FIG. 3 by the vertical bars, with the theoretically given known amplitude distribution of the measurement signal used, the latter can also be faded in in the display image, as indicated in FIG. 3 by the horizontal short dashes for each amplitude window.

Any signal with a known amplitude distribution is suitable as a measurement signal; preferably a signal that is also transmitted in operation via the transmission channel to be measured is used, for example a digital television signal processed according to the DVB-T standard.

What is claimed is:

1. A method for displaying amplitude distortions of a transmission channel, said method comprising:
   transmitting a measurement signal of a known amplitude distribution via the transmission channel;
   measuring amplitude values at an output of the transmission channel;
   converting the amplitude values into digital values;
   dividing an amplitude values measuring range into adjacently connected amplitude windows;
   determining from a given multitude of the digital values a frequency of occurrence of the amplitude values in the adjacently connected amplitude windows, to thereby determine amplitude frequency values; and
   displaying via a display device the amplitude frequency values thus ascertained for each of the amplitude windows, wherein a reference value is a root-mean-square value ascertained from the amplitude frequency values determined in all, and only the amplitude frequency values of the amplitude windows occurring above the reference value are displayed, and a quadratically weighted average is calculated from a sum of the amplitude frequency values as the reference value.

2. The method of claim 1, wherein the amplitude frequency values are determined, then the reference value is ascertained and the amplitude frequency values determined above this reference value are combined and added to form groups respectively, and totals of the respectively combined groups of amplitude frequency values are displayed in the adjacently connected amplitude windows.

3. The method of claim 1, wherein a crest factor is calculated from a greatest amplitude frequency value ascertained and from the reference value.

4. The method of claim 3, wherein the amplitude frequency values are ascertained for each amplitude window respectively for several successive given multitudes $n_{max}$ of amplitude measured values to ascertain a cumulative frequency, and then a relative amplitude frequency for each amplitude window is calculated and displayed.

5. The method of claim 4, wherein the crest factor is also determined for several successive given multitudes of amplitude measured values and a relative crest factor is calculated via the cumulative frequency ascertained therefrom and displayed.

6. The method of claim 1, wherein an ideal amplitude frequency of the measurement signal is also displayed in the amplitude windows at the same time.

7. The method of claim 1, wherein a current percentage of a momentarily evaluated number of given multitudes is also displayed at the same time.

* * * * *